(12) United States Patent
Zeng et al.

(10) Patent No.: US 9,159,895 B2
(45) Date of Patent: Oct. 13, 2015

(54) VERTICAL LIGHT EMITTING DEVICE AND MANUFACTURING METHOD THEREOF

(71) Applicant: Xiamen Sanan Optoelectronics Technology Co., Ltd., Xiamen (CN)

(72) Inventors: Xiaoqiang Zeng, Xiamen (CN); Shunping Chen, Xiamen (CN); Shaohua Huang, Xiamen (CN); Qunfeng Pan, Xiamen (CN); Jyh-Chiarng Wu, Xiamen (CN)

(73) Assignee: Xiamen Sanan Optoelectronics Technology Co., Ltd., Fujian (CN)

( * ) Notice: Subject to any disclaimer, the term of this patent is extended or adjusted under 35 U.S.C. 154(b) by 0 days.

(21) Appl. No.: 14/394,851

(22) PCT Filed: Mar. 19, 2013

(86) PCT No.: PCT/CN2013/072866
§ 371 (c)(1),
(2) Date: Oct. 16, 2014

(87) PCT Pub. No.: WO2013/159615
PCT Pub. Date: Oct. 31, 2013

(65) Prior Publication Data
US 2015/0060895 A1    Mar. 5, 2015

(30) Foreign Application Priority Data

Apr. 28, 2012   (CN) .......................... 2012 1 0130389

(51) Int. Cl.
| H01L 33/00 | (2010.01) |
| H01L 33/62 | (2010.01) |
| H01L 25/075 | (2006.01) |
| H01L 33/20 | (2010.01) |
| H01L 33/44 | (2010.01) |

(52) U.S. Cl.
CPC ............ *H01L 33/62* (2013.01); *H01L 25/0753* (2013.01); *H01L 33/20* (2013.01); *H01L 33/44* (2013.01); *H01L 2924/0002* (2013.01); *H01L 2933/0033* (2013.01)

(58) Field of Classification Search
CPC ... F24F 11/0012; F24F 11/0034; H01J 61/86; H01J 61/073; H01J 61/12; H01J 61/025; H01J 2229/964; H01J 29/72; H01J 29/861; H01J 29/96; H01J 61/0732; H01J 9/42; G02B 27/225; G02B 5/08
USPC ............................................. 257/88; 438/34
See application file for complete search history.

(56) References Cited

U.S. PATENT DOCUMENTS 7,973,331 B2    7/2011  Hsu et al.

FOREIGN PATENT DOCUMENTS

| CN | 101145570 | 3/2008 |
| CN | 101849298 | 9/2010 |
| CN | 102110683 | 6/2011 |
| CN | 102130107 | 7/2011 |
| CN | 202103092 | 1/2012 |
| CN | 102637681 | 8/2012 |

OTHER PUBLICATIONS

International Search Report in re: PCT/CN2013/072866, "Vertical Light Emitting Device and Manufacturing Method Thereof", Date of Mailing Jul. 4, 2013.

*Primary Examiner* — Julio J Maldonado
*Assistant Examiner* — Robert Bachner
(74) *Attorney, Agent, or Firm* — Hamilton, Brook, Smith & Reynolds, P.C.

(57) ABSTRACT

A vertical high-voltage light emitting device and a manufacturing method thereof. Polarities of two adjacent light emitting diodes (LEDs) are reversed by means of area laser stripping and die bonding, and the two diodes whose polarities are reversed are disposed on an insulating substrate comprising a bonding metal layer (320). A conductive wire (140) is distributed on a surface of the light emitting device, so that a single LED unit (330) has a vertical structure, and multiple LEDs are connected in series to form a high-voltage LED, thereby solving the problems of low light emitting efficiency and large thermal resistance of a horizontal structure.

10 Claims, 11 Drawing Sheets

US 9,159,895 B2

VERTICAL LIGHT EMITTING DEVICE AND MANUFACTURING METHOD THEREOF

This application is the U.S. National Stage of International Application No. PCT/CN2013/072866, filed Mar. 19, 2013, which designates the U.S., published in Chinese, and claims priority under 35 U.S.C. 119 or 365(c) to Chinese Patent Application No. 201210130389.2, filed Apr. 28, 2012. The entire teachings of which is hereby incorporated by reference in its entirety.

FIELD OF THE INVENTION

The present invention relates to a semiconductor luminous element and fabrication method thereof, and more particularly, to a vertical HV luminous element and fabrication method thereof.

BACKGROUND OF THE INVENTION

The LED of solid luminous elements, owing to electrical and optical advantages such as low energy consumption, long service life, good stability, small size, fast response and stable luminous wave length, is widely applied in fields like illumination, household appliance, display and indicator. Moreover, this kind of luminous elements enjoys considerable progress in luminous effect and service life and therefore, is promising to become the mainstream for a new generation of lighting and luminous elements.

Mains electricity is AC (alternating current). Traditional DC LED elements need to use power converters such as switch power to convert the commercial power supply into low-voltage power, which causes loss during this process.

FIG. 1 is the sectional structural view of a lateral HV LED, which reduces power loss at the power conversion end; however, the single LED unit 110 has a lateral structure that cannot be driven by high current density owing to low luminous efficiency, current blockage, high thermal resistance, etc., of lateral LED chips.

SUMMARY OF THE INVENTION

The present invention relates to a vertical HV luminous element and fabrication method thereof, which achieves polarity reversal of two adjacent LEDs via regional laser stripping and die bonding. The two polarity-reversed LEDs are placed on an insulating substrate containing metal bonding wires; and wires are made on the surfaces of the luminous elements to make the single LED cell as vertical structure and a plurality LED cascaded into HV LED, thus overcoming the problems of low luminous efficiency and high thermal resistance of the traditional lateral structure.

According to a first aspect of the present invention, a vertical luminous element comprises: an insulating substrate consisting of a front main surface and a back main surface, wherein the front main surface is distributed with a bonding metal layer cell array; a luminous module formed on the front main surface of the first substrate, including a plurality of luminous cells corresponding to the bonding metal layer cells one by one; each luminous cell is composed of two reversely-arranged LEDs; two luminous cells are separated from each other and are cascaded with each other via the bonding metal layer; wherein a first LED comprises a p-type layer, an active area and an n-type layer from top down, and a second LED comprises an n-type layer, an active area and a p-type layer from top down; a conductive structure that cascades the plurality of luminous cells together, wherein the first LED of each luminous cell is connected with the second LED of the adjacent luminous cell.

In the present invention, an insulating layer is provided among the luminous cells for mutual isolation; and an insulating layer is provided between two LEDs of each luminous cell for mutual isolation. In a first preferred embodiment of the present invention, the vertical luminous element is connected with the DC, which consists of two electrodes that are connected with the first and last luminous cells of the luminous module, respectively, thus forming a series circuit. In a second preferred embodiment of the present invention, the vertical luminous element is connected with the AC, which consists of two electrodes that are arranged symmetrically and are connected with two adjacent luminous cells, thus forming a series-parallel circuit.

According to a second aspect of the present invention, a fabrication method of the vertical luminous element comprises: 1) providing a growth substrate, on which a luminous epitaxial layer is formed via epitaxial growth, which at least comprises an n-type layer, an active layer and a p-type layer from down up; 2) defining the size of a single LED and dividing the luminous epitaxial layer into two LED series, wherein each LED of the first series is adjacent to each LED of the second series; 3) providing an insulating substrate, on which the bonding metal layer cell arrays are fabricated. An isolating area is provided among the bonding metal layer cells; 4) transferring the first LED series to the patterned bonding metal layer of the insulating substrate; the n-type layer is the light-emitting surface and each LED corresponds to a bonding metal layer cell; 5) through the second substrate transfer, transferring the second LED series to the patterned bonding metal layer of the insulating substrate; the p-type layer is the light-emitting surface and each bonding metal layer cell consists of a first series LED and a second series LED, which are arranged reversely with an isolating area provided; and 6) filling the isolating area and fabricating a conductive structure on the isolating area and the element surface such that the LED cells are connected into an LED sequence of cascaded structure.

In the fabrication method of the present invention, the step 5) includes: providing a temporary substrate and connecting the second LED series with the temporary substrate; lifting off the growth substrate to isolate the second LED series from the growth substrate; and connecting the second LED series with the permanent substrate and removing the temporary substrate. In the first preferred embodiment of the present invention, it further comprises: the step 7) fabricates the electrode structures on the first and last LEDs of the LED sequence, respectively, to form a series circuit. In this way, a vertical DC HV luminous element is formed. In a second preferred embodiment of the present invention, the step 7) fabricates two electrodes that are arranged symmetrically and are simultaneously connected with two adjacent luminous cells, thus forming a series-parallel circuit. In this way, a vertical AC HV luminous element is formed.

The present invention solves the problems like current blockage and high thermal resistance of the prior art lateral HV LED via the vertical structure. On the other hand, multiple LED chips reversely arranged on the insulating substrate designed with wires make connecting easier and stability higher than the traditional lateral structural chip. The vertical structure fabrication avoids the light-emitting area loss due to electrical contact in the lateral structural design, thus improving the brightness.

The other features and advantages of the present invention will be described in detail in the following Description, and it is believed that such features and advantages will become apparent partially through the specification or through the embodiments. The purposes and other advantages of the present invention can be realized and obtained in the structures specifically described in the Description, Claims and Drawings.

BRIEF DESCRIPTION OF THE DRAWINGS

The accompanying drawings, which are included to provide a further understanding of the invention and constitute a part of this Description, together with the embodiments, are therefore to be considered in all respects as illustrative and not restrictive. In addition, the drawings are merely illustrative, which are not drawn to scale.

IN THE DRAWINGS

100: substrate; 130: LED cell; 131: n-GaN layer; 132: luminous layer; 133: p-GaN layer; 140: conductive wire; 151: n electrode; 152: p electrode; 200: insulating substrate; 210: bonding metal layer cell array; 220: second bonding metal layer; 230: LED cell; 231: n-GaN layer; 232: luminous layer; 233: p-GaN layer; 240: conductive structure; 251: n electrode; 252: p electrode; 260: insulating layer; M1: first luminous cell; M2: second luminous cell; 301: growth substrate; 302: permanent insulating substrate; 303: temporary substrate; 310: bonding metal layer cell array; 320, 322: bonding metal layer; 321: bonding layer; 330: LED cell; 331: n-GaN layer; 332: luminous layer; 333: p-GaN layer; 340: conductive structure; 370: isolating area; L1: first LED series; L2: second LED series; 440, 540: conductive structure; 451, 551: first electrode; 452, 552: second electrode.

SPECIFIC EMBODIMENTS

The embodiments of the present invention will be described in detail with reference to the accompanying drawings and examples, to help understand and practice the disclosed embodiments, regarding how to solve technical problems using technical approaches for achieving the technical effects. It should be understood that as long as there is no conflict, the embodiments and their characteristics described in the present invention may be combined with each other and such technical proposals are deemed to be within the scope of the present invention without departing from the spirit of this invention.

Figure 3:
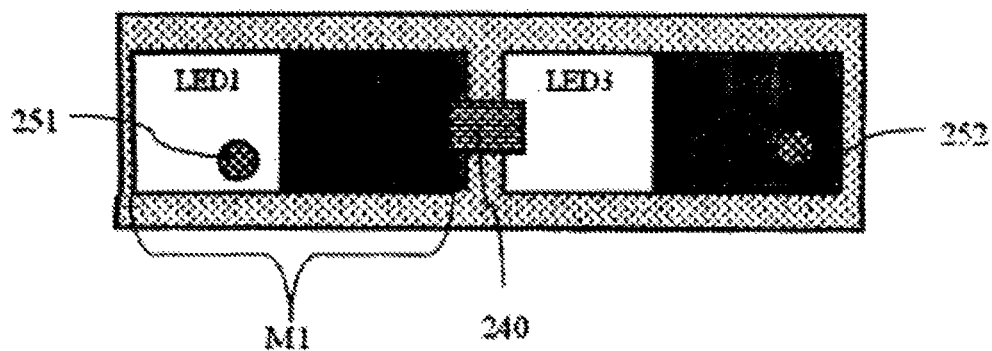
FIG. 3 is a top view of the vertical luminous element shown in FIG. 2.

In the Description and Claims, "luminous module", "luminous cell" and "LED" are mentioned for several times to clearly illustrate the present invention. The detailed specification is made as follows: the light-emitting diode refers to an element having a pn junction, which is illustrated as LED in the text and the drawings; the luminous cell means two LEDs reversely arranged on the conductive material layer with opposite polarities. FIG. 3 shows the specific structure of a luminous cell M1, which will be illustrated in detail in combination with embodiments; and several luminous cells form a luminous module.

The present invention is mainly applied to HV luminous elements, each luminous element consisting of a series of LED cells. To make it simple, detailed description will be made with a 4-LED structure.

Figure 1:
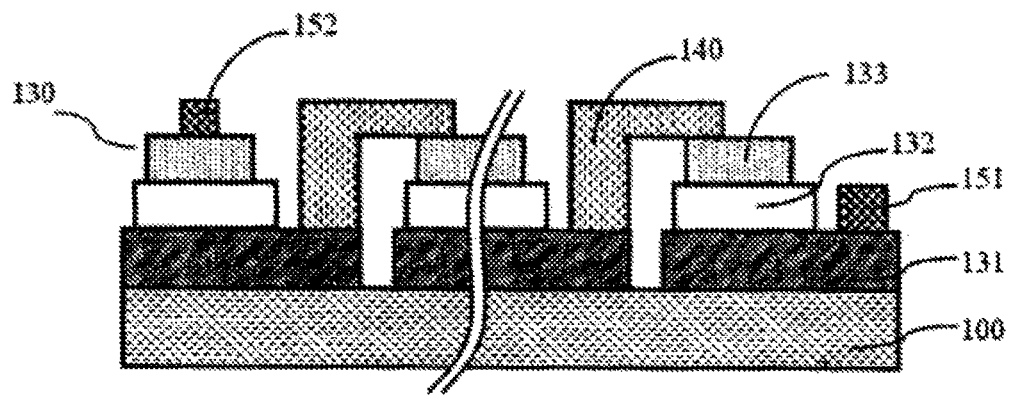
FIG. 1 is a side sectional view of a lateral HV luminous element.
Figure 2:
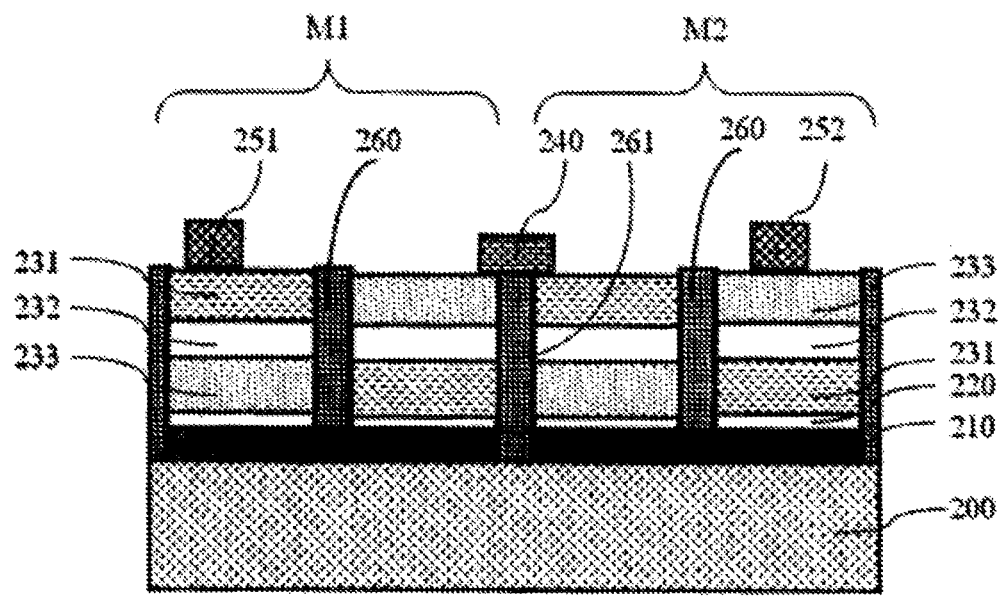
FIG. 2 is a side sectional view of 4 LED vertical luminous elements according to the present invention.
Figure 4:
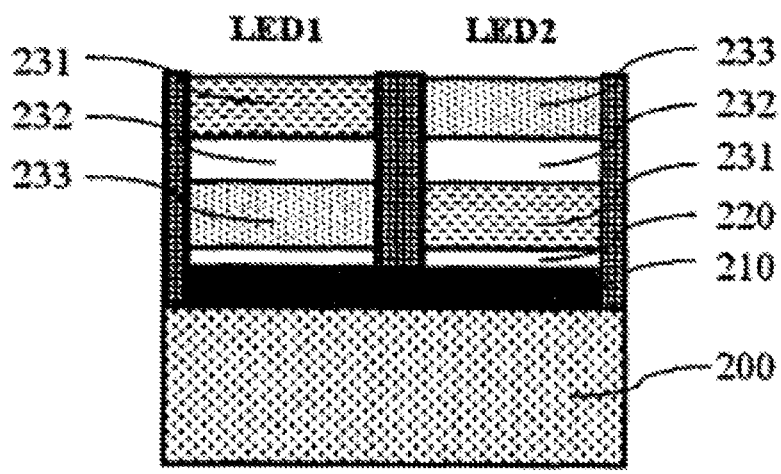
FIG. 4 is a side sectional view of the luminous cell M1 in the vertical luminous element shown in FIG. 2.

As shown in FIGS. 2-3, a vertical luminous element having 4 LEDs comprises an insulating substrate 200, two luminous cells M1 and M2, a conductive structure 240 and electrodes 251 and 252. The insulating substrate 200 adopts a well-dissipated material (AlN or ceramic). The bonding metal layer cell arrays 210 are distributed on the insulating substrate 200, each sized slightly more than the areas of two LEDs. The cell arrays are in general in quadrilateral or may be arranged based on the specific shapes of LED, like triangle or circular shape. The material is one or several types from Cr, Al, Pt, Au or Ti. The adjacent bonding metal layer cells are isolated from each other. A luminous cell (M1 or M2) is arranged corresponding to each bonding metal layer cell. Two luminous cells are separated from each other via the insulating layer 261 and are cascaded via the conductive structure 240. The basic structure of the luminous cell is shown in FIG. 4, consisting of LED1 and LED2. LED1 comprises an n-GaN layer 231, a luminous layer 232 and a p-GaN layer 233 from top down and LED2 comprises a p-GaN layer 233, a luminous layer 232 and an n-GaN layer 231 from top down. The p-GaN layer 233 of LED1 connects with the n-GaN layer 231 of LED2 via the bonding metal layer 210. The insulating layer 260, on the one hand, protects the luminous epitaxial layer and on the other hand, separates LED1 and LED2. The conductive structure 240 can be metal wire, which connects the p-GaN layer 233 of M1 LED2 and the n-GaN layer of M2 LED3. The electrode 251 is on the n-GaN layer 231 of LED1 and the electrode 252 is on the p-GaN layer 233 of LED4. The four LED cells form a series circuit.

In the following, detailed descriptions will be given for the fabrication method of vertical luminous element with reference to FIGS. 5-19. The fabrication method mainly includes epitaxial growth, division of the luminous epitaxial layer into cells, substrate transfer of the first LED series L1, second substrate transfer of the second LED series L2, fabrication of conductive structure, etc. In general, one epitaxial wafer can be divided into thousands of LED chips. To make it simple, the luminous epitaxial layer is divided into a 4*4 LED array.

Figure 5:
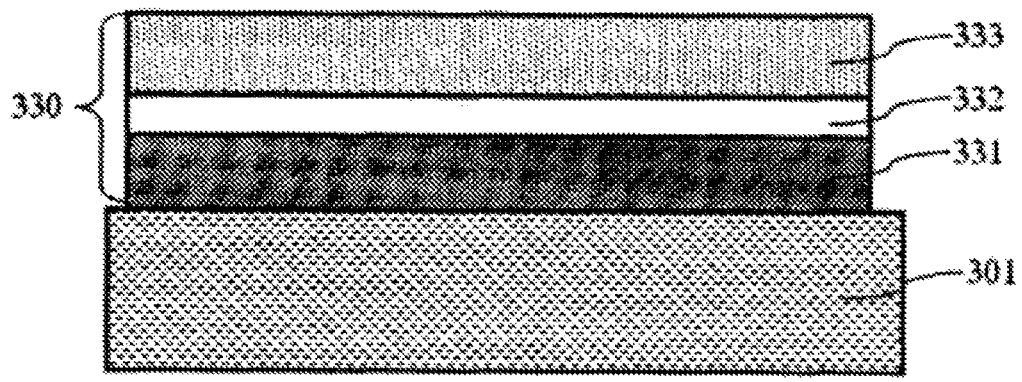
FIGS. 5~20 are schematic cross sections of the vertical luminous element fabrication according to the present invention.

As shown in FIG. 5, grow an n-GaN layer 331, a luminous layer 332 and a p-GaN layer 333 successively on a growth substrate 301 (e.g. sapphire) via MOCVD to form a luminous epitaxial layer 330.

Figure 6:
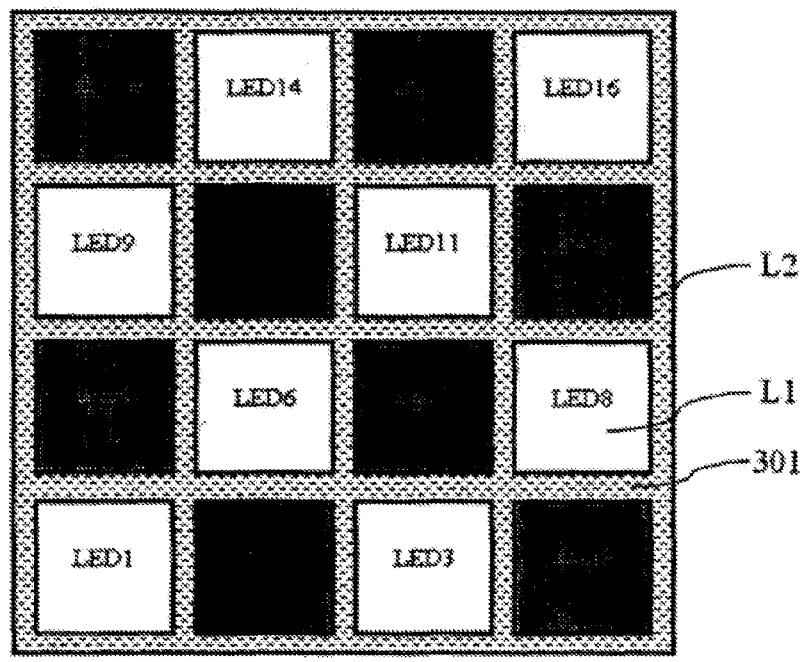
Figure 7:
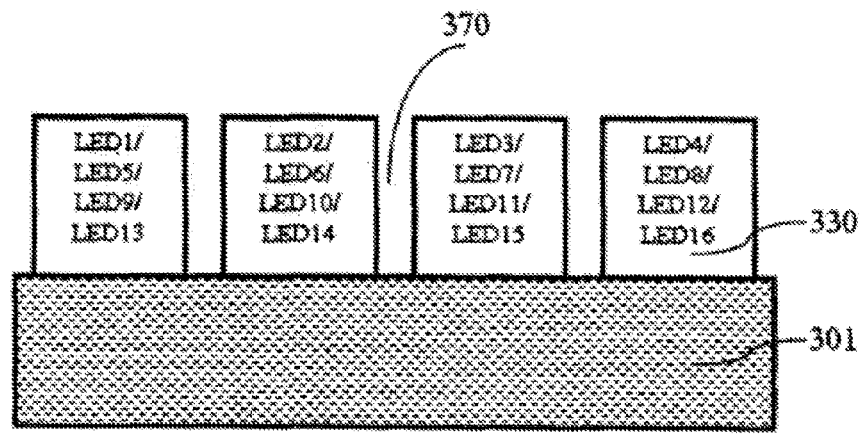

As shown in FIG. 7, in the next step, define the size of a single LED and divide the luminous epitaxial layer 330 into LED arrays. More particularly, firstly define the size of a single LED and pattern the epitaxial layer via mask. Punch through the epitaxial layer via the ICP dry etching to expose the insulating substrate and generate an isolating area 1. Divide the luminous epitaxial layer into 4*4 array LED series and divide the LED cell into two LED series L1 and L2. FIG. 6 is a top view after the division. As shown in FIG. 6, LED1, LED3, LED6, LED8, LED9, LED11, LED14 and LED16 are the first LED series L1, as represented by white background in the figure; and LED2, LED4, LED5, LED7, LED10, LED12, LED13 and LED15 are the second LED series L2, as represented by gray background in the figure.

Figure 8:
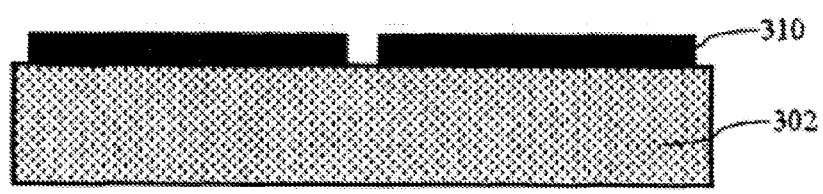
Figure 9:
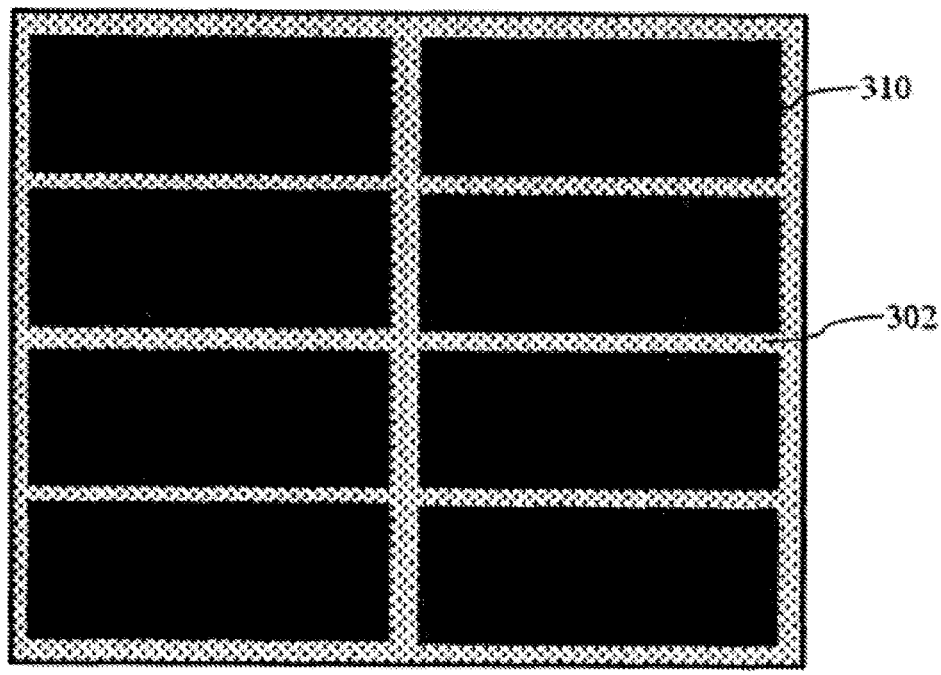

As shown in FIG. 8, provide a permanent insulating substrate 302 fabricated with bonding metal layer cell arrays 310. More particularly, fabricate the bonding metal pattern 310 on the permanent insulating substrate 302 (e.g., AlN) with the vacuum electron beam evaporation coating. The bonding metal layer may include one or several elements of Cr, Al, Pt, Au and Ti. Sized slightly more than the areas of two LEDs, the bonding metal layer cell is in general in quadrilateral or is arranged based on the specific shapes of LED, like triangle or circular shape. See FIG. 9 for the top view.

Figure 10:
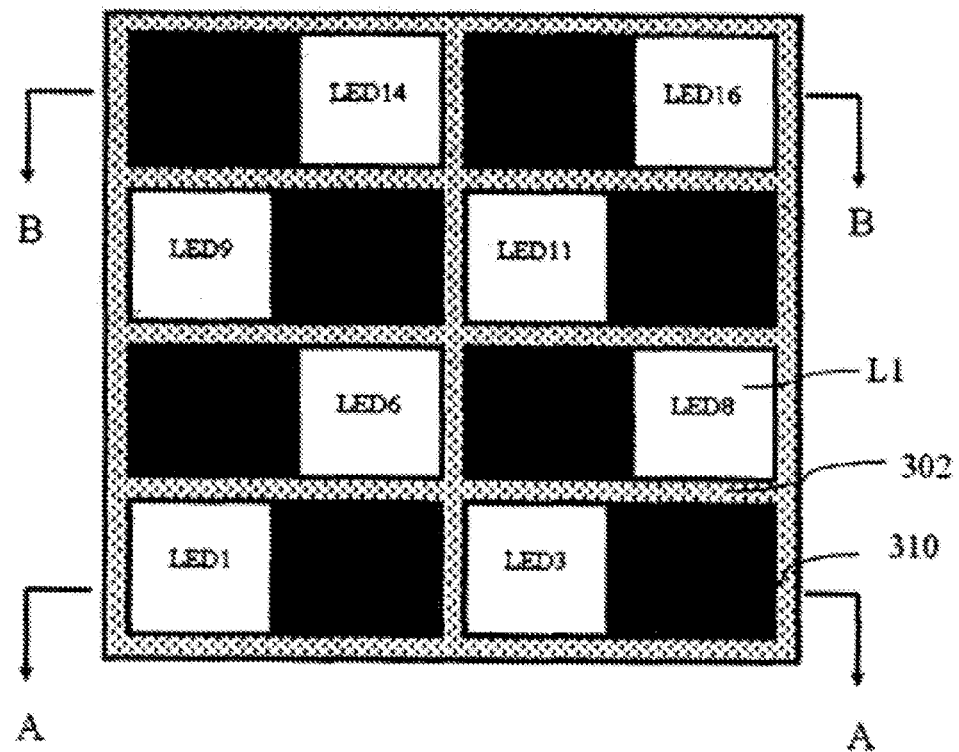
Figure 11:
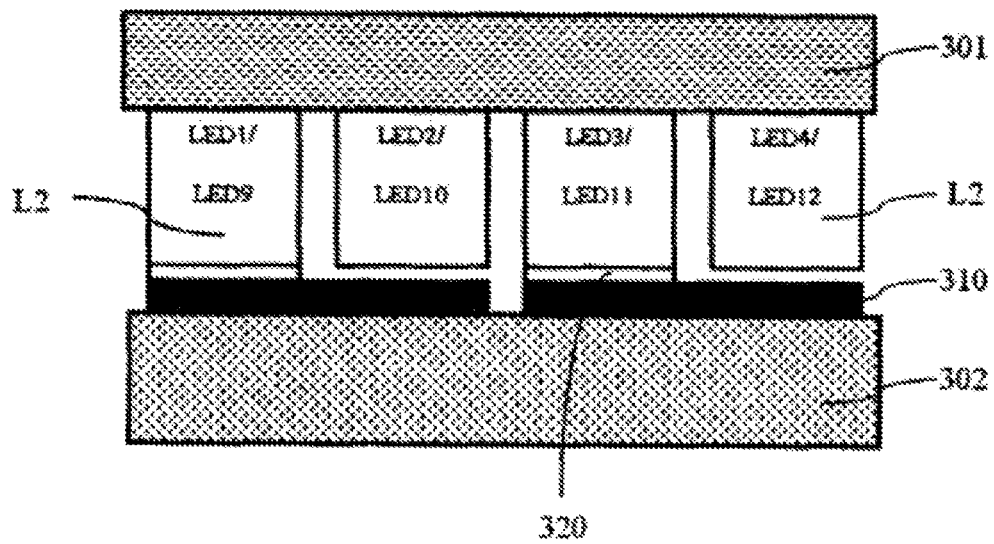
Figure 12:
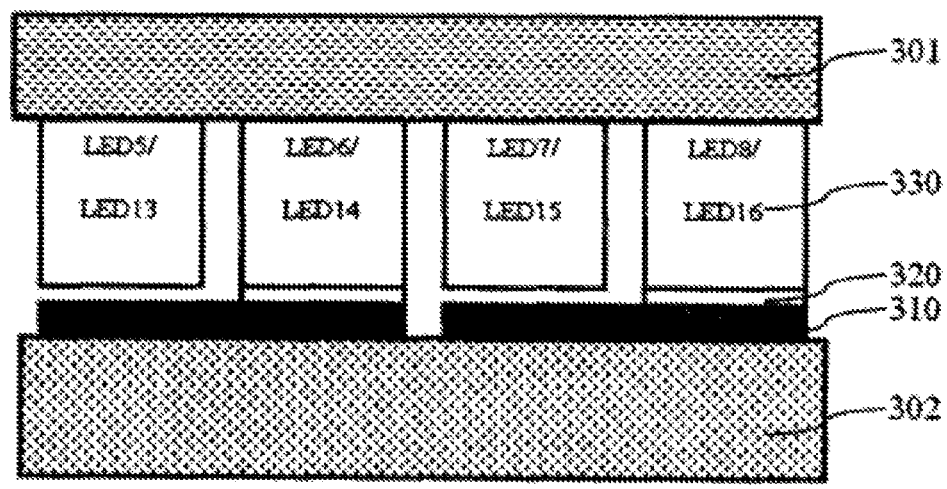
Figure 13:
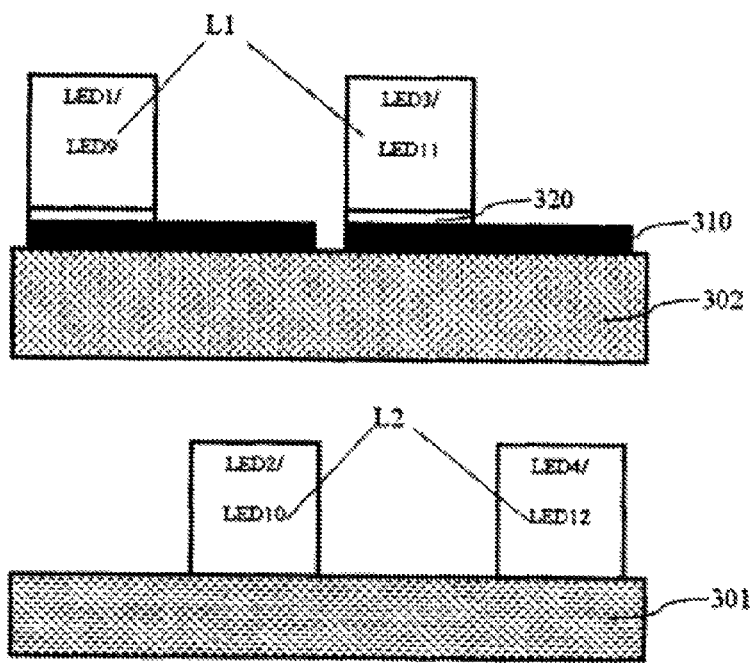
Figure 14:
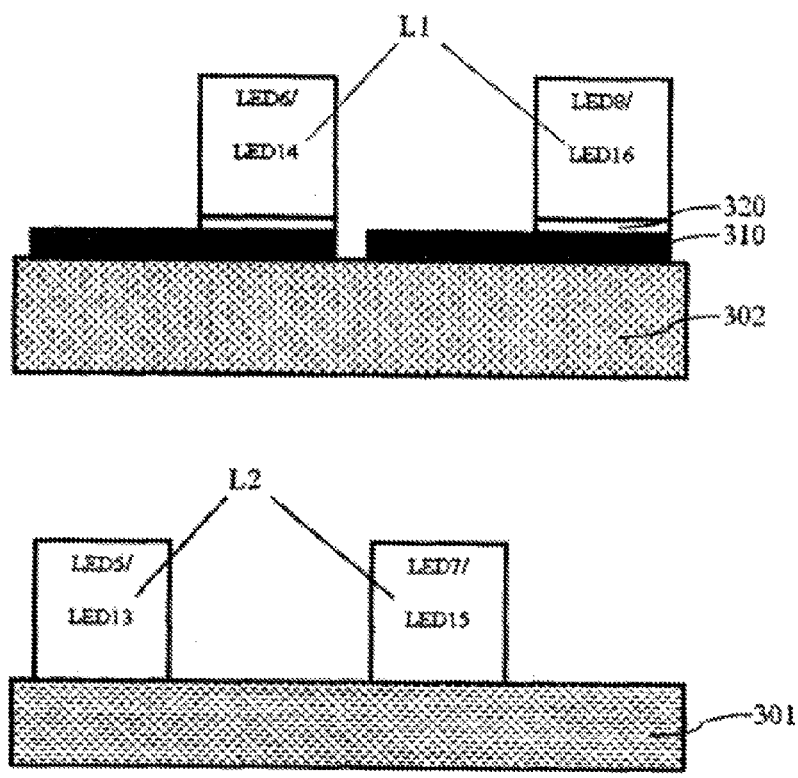

As shown in FIG. 10, transfer the first LED series L1 to the permanent insulating substrate 302. Make the n-type layer as the light emitting surface and connect the p-type layer to the permanent insulating substrate. More particularly, deposit a bonding metal layer 320 on the p-GaN layer 333 of the first LED series L1 through the vacuum electron beam evaporation coating. This bonding metal layer may include one or several elements of Ag, Ni, Al, Pt, Au and Ti, the total thickness thereof is not lower than 5 µm and the optimal thickness is 7 µm; bond the bonding metal layer 320 of the p-GaN layer 333 of the second LED series L1 with the bonding metal layer cell array 310 of the permanent insulating substrate 302 through the wafer bonding equipment. The second LED series L2 is not bonded or contacted with the substrate. Refer to FIGS. 11 and 12 for the sectional structures. FIG. 11 is a sectional view of an odd-numbered-line LED array (i.e., the sectional view along A-A in FIG. 10) and FIG. 12 is the sectional view of even-numbered-line LED array (i.e., the sectional view along B-B in FIG. 10). Isolate the first LED series L1 from the growth substrate 301. In one preferred embodiment of the present invention, select sapphire as the growth substrate. Selectively lift off the growth substrate through the 248 nmKrF gas laser such that the first LED series L1 is lifted off the sapphire substrate and leave the second LED series L2 on the sapphire substrate. Refer to FIGS. 13 and 14 for the sectional structures. FIG. 13 is the sectional view of odd-numbered-line LED array and FIG. 14 is the sectional view of even-numbered-line LED array.

Figure 15:
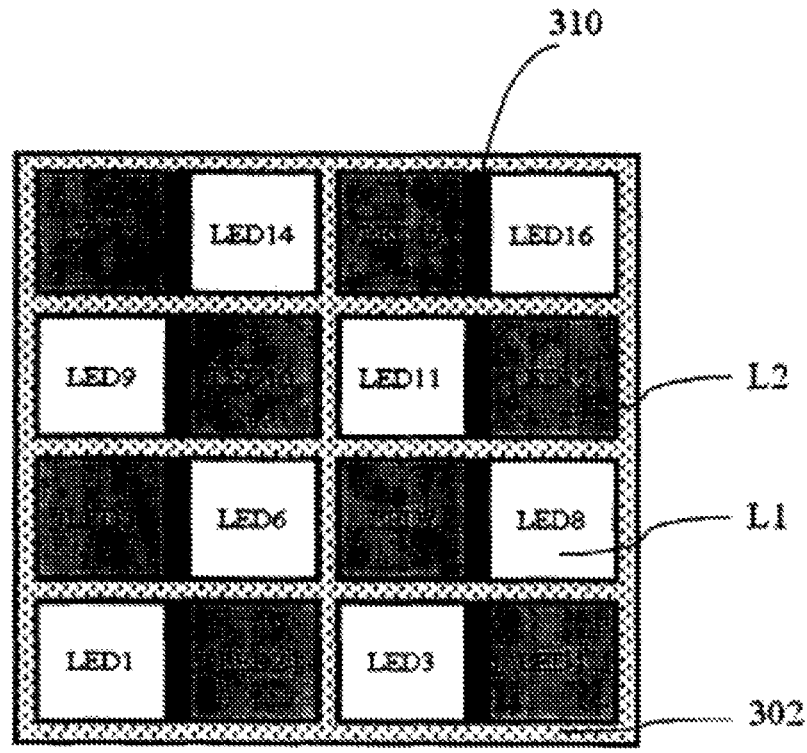
Figure 16:
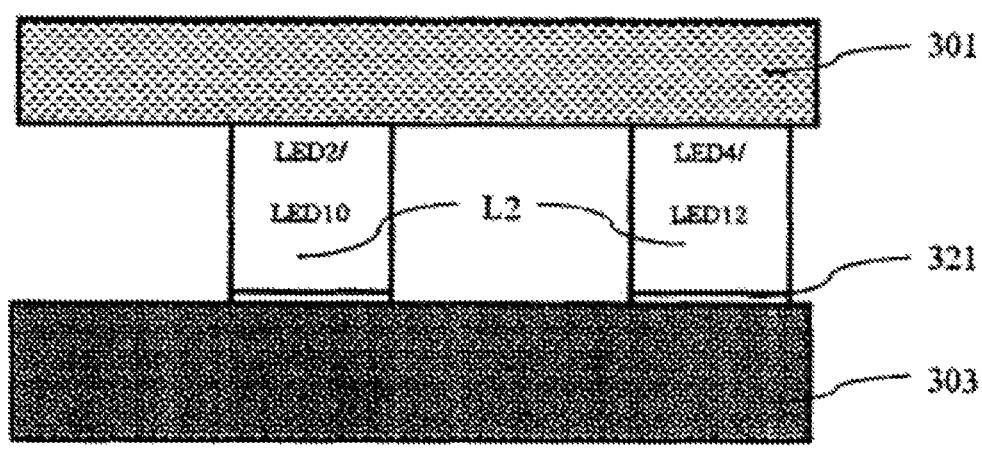
Figure 17:
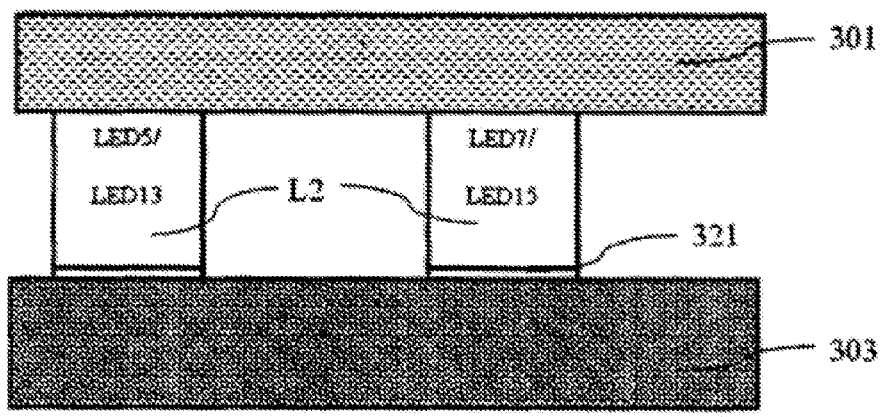
Figure 18:
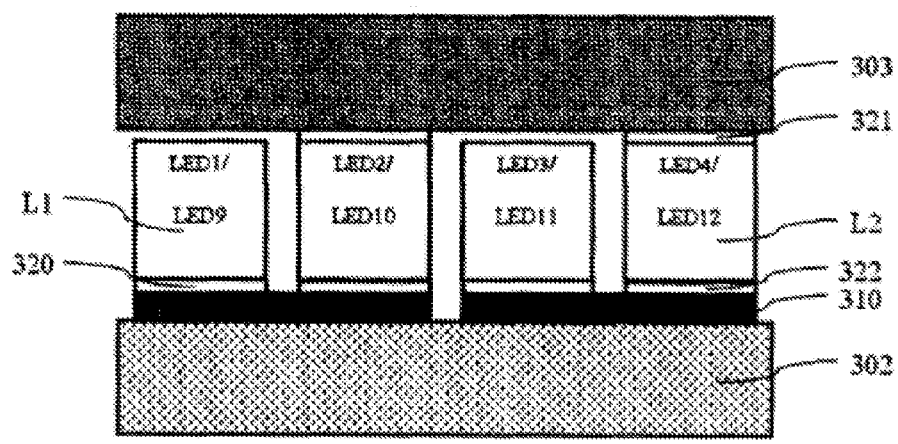
Figure 19:
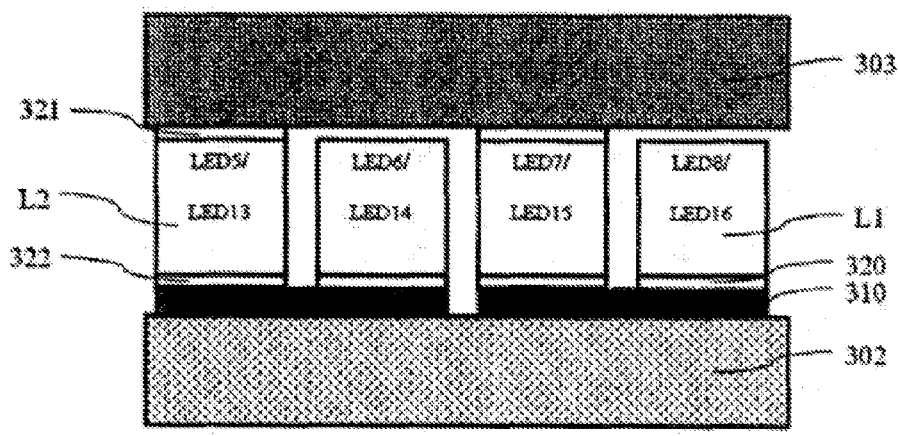

As shown in FIG. 15, transfer the second LED series L2 to the permanent insulating substrate 302 via second substrate transfer and make the second LED series arranged on the permanent substrate reversal to the first LED series L1; make the p-type layer as the light-emitting surface and connect the n-type layer to the bonding metal layer on the permanent substrate. More particularly, firstly, paint a layer of organic glue as the bonding layer 321 not less than 7 µm thick (optimal thickness: 10 µm) on the temporary substrate 303 and form an organic glue area of equal area with the second LED series L2 via the yellow light technology; bond this temporary substrate with the second LED series L2 with the die pasting and bonding method. Refer to FIGS. 16 and 17 for the sectional structures (FIG. 16 is the sectional view of odd-numbered-line LED array and FIG. 17 is the sectional view of even-numbered-line LED array). Selectively lift off the sapphire substrate through the 248 nmKrF gas laser such that the second LED series L2 is lifted from the sapphire substrate and kept on the temporary substrate 303. Subsequently, deposit a bonding metal layer 322 on the n-GaN layer of the second LED series L2 through the vacuum electron beam evaporation coating. This bonding metal layer may include one or several elements of Ag, Ni, Al, Pt, Au and Ti, the thickness thereof should not be less than 5 µm and the optimal thickness is 7 µm; bond the bonding metal layer 322 of the n-GaN layer of the second LED series L2 with the bonding metal layer 310 of the permanent insulating substrate 302 through the die pasting and bonding method. Refer to FIGS. 18 and 19 for the sectional structures (FIG. 18 is the sectional view of odd-numbered-line LED array and FIG. 19 is the sectional view of even-numbered-line LED array). Lastly, remove the temporary substrate and remove the organic glue on the p-type semiconductor layer of the LED series 9~16. The n-GaN layer of the first LED series L1 and the p-GaN layer of the second LED series L2 are exposed on the surface at the same time.

Figure 20:
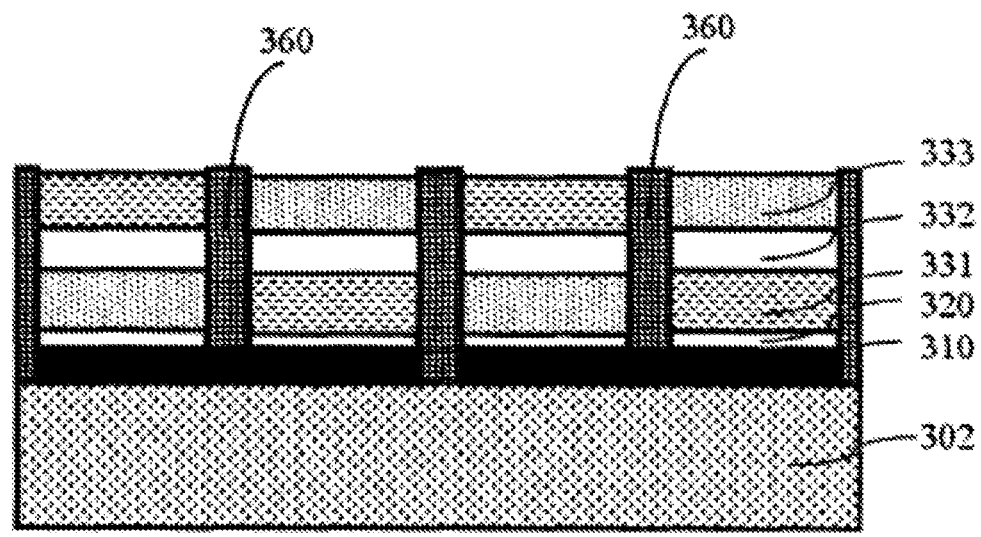

Further, as shown in FIG. 20, fill the gaps of the isolating area with an organic glue (e.g. an organic material like BCB or SU8) in a height flush to the epitaxial layer surface to form the insulating layer 360.

Further, fabricate a metal wire on the front surface the first LED of each luminous cell and the front surface of the second LED of the adjacent luminous cell to form the conductive structure. The metal wire may include one or several elements of Cr, Al, Pt, Au and Ti. Based on different wiring methods, the DC or AC element structure can be formed. In the following, detailed descriptions will be given with reference to Embodiments 1 and 2.

Embodiment 1

Figure 21:
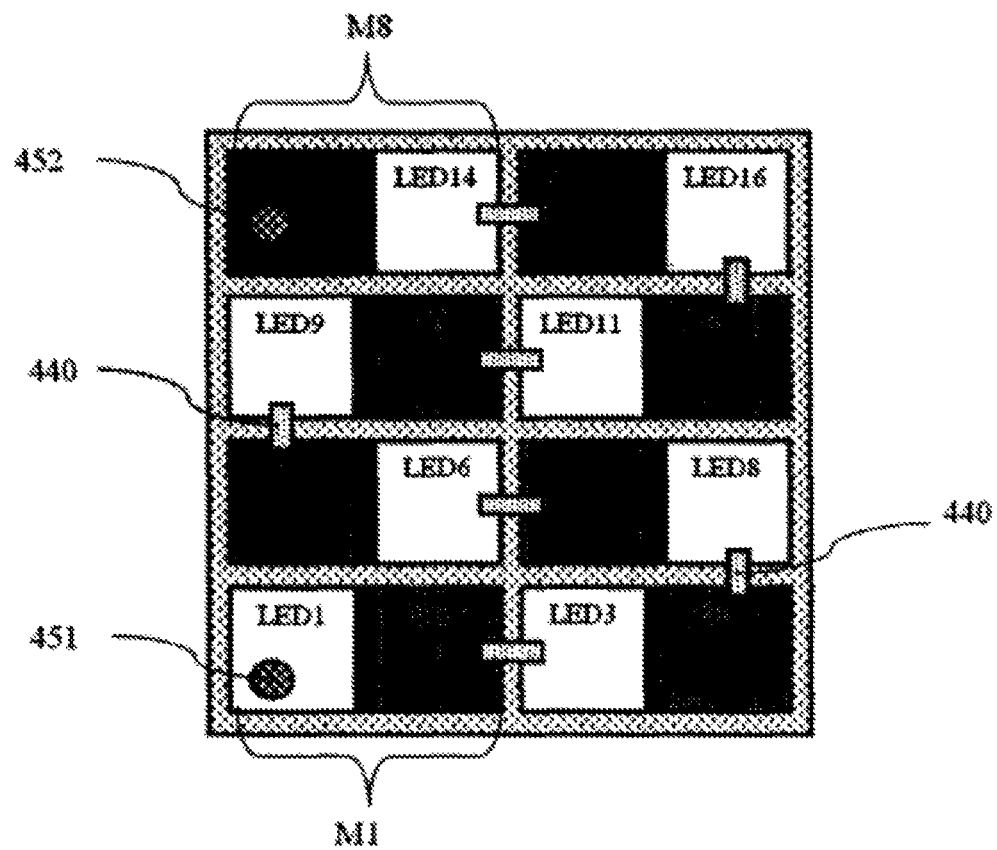
FIG. 21 is a top view of the vertical DC HV luminous element according to the present invention.
Figure 22:
FIG. 22 is an equivalent circuit diagram of FIG. 21.

FIG. 21 is a top view of the vertical DC HV luminous element according to the present invention. As shown in FIG. 21, fabricate metal wires at 7 connection points between "LED2 and LED3, LED4 and LED8, LED7 and LED6, LED5 and LED9, LED10 and LED11, LED12 and LED16, LED15 and LED14" to form the conductive structure 440. Fabricate the first electrode 451 on LED1 and the second electrode 452 on LED13. The 16-series vertical DC HV LED luminous element is fabricated. Refer to FIG. 22 for the circuit diagram.

Embodiment 2

Figure 23:
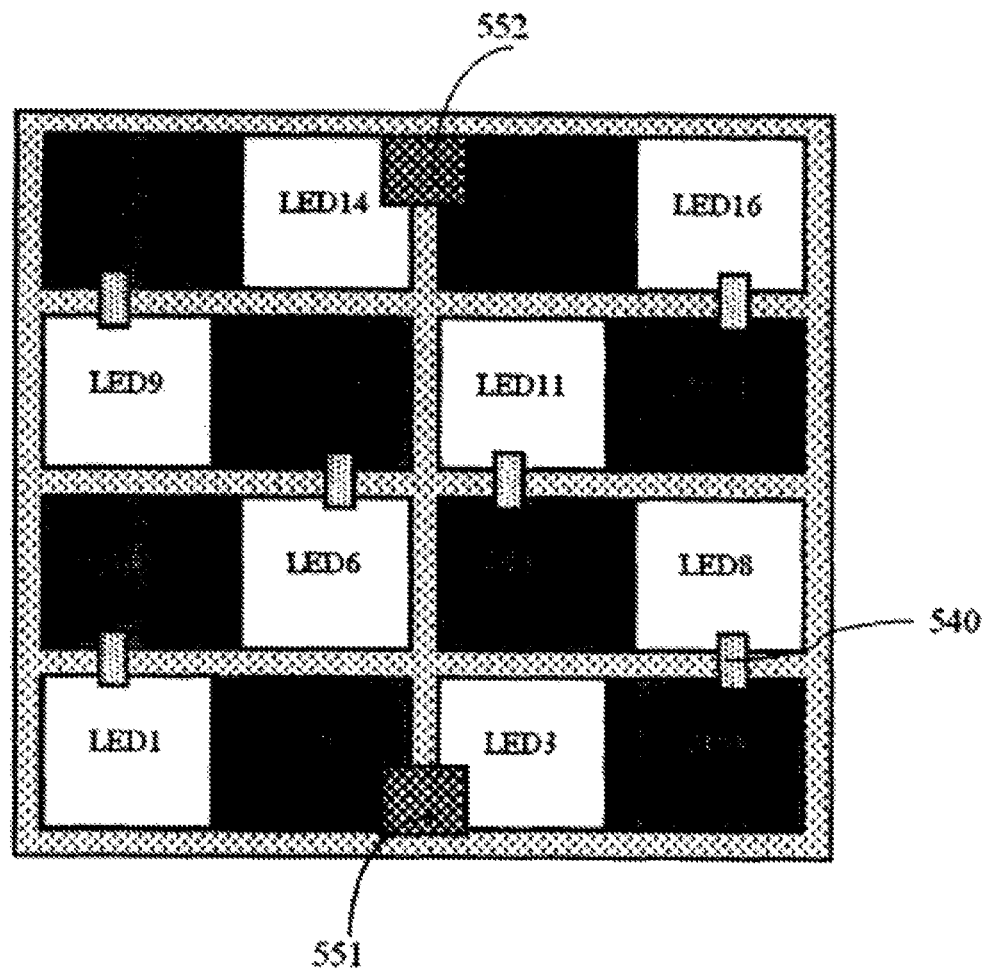
FIG. 23 is a top view of the vertical AC HV luminous element according to the present invention.
Figure 24:
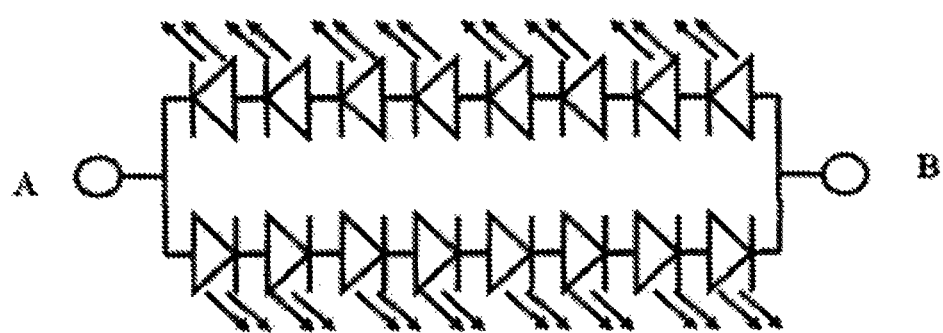
FIG. 24 is an equivalent circuit diagram of FIG. 23.

FIG. 23 is a top view of vertical AC HV luminous element according to the present invention. As shown in FIG. 23, fabricate metal wires at 6 connection points between "LED1 and LED5, LED4 and LED8, LED6 and LED10, LED7 and LED11, LED9 and LED13, LED12 and LED16" to form the conductive structure 540. Fabricate the first electrode 551 between LED2 and LED3, which connects the p-GaN layer of LED2 and the n-GaN layer of LED3; and fabricate the second electrode 552 between LED14 and LED15, which connects the n-GaN layer of LED14 and the p-GaN layer of LED15. The vertical AC HV LED luminous element is fabricated. Refer to FIG. 24 for the circuit diagram. The flow of the first LED circuit current is: A-LED14-LED13-LED9-LED10-LED6-LED5-LED1-LED2-B; and the flow of the second circuit current is B-LED3-LED4-LED8-LED7-LED11-LED12-LED16-LED15-B.

Apparently, it will be understood that the present invention is not limited to the embodiments disclosed, but is capable of all embodiments without departing from the spirit of the invention.

What is claimed is:
1. A vertical luminous element, comprising:
an insulating substrate consisting of a front main surface and a back main surface, wherein the front main surface is distributed with bonding metal layer cell arrays;
a luminous module formed on the front main surface of the first substrate, including a plurality of luminous cells corresponding to the bonding metal layer cells one by one;
each luminous cell is composed of two reversely-arranged LEDs; two luminous cells are separated from each other and are cascaded with each other via the bonding metal layer; wherein a first LED comprises a p-type layer, an active area and an n-type layer from top down, and a second LED comprises an n-type layer, an active area and a p-type layer from top down; and a conductive structure that cascades the plurality of luminous cells together, wherein the first LED of each luminous cell is connected with the second LED of the adjacent luminous cell.

2. The vertical luminous element according to claim 1, characterized in that an insulating layer is provided between two LEDs of each luminous cell for mutual isolation.

3. The vertical luminous element according to claim 1, characterized in that an insulating layer is provided among the luminous cells for mutual isolation.

4. The vertical luminous element according to claim 1, characterized in that the vertical luminous element further comprises two electrodes that are connected with the first and last luminous cells of the luminous module, respectively, thus forming a series circuit.

5. The vertical luminous element according to claim 1, characterized in that it further comprises two electrodes that are connected with two adjacent luminous cells, thus forming a series-parallel circuit.

6. The vertical luminous element according to claim 3, characterized in that the conductive structure is the metal wire formed on the front surface of the first LED of each luminous cell and the front surface of the second LED of the adjacent luminous cell.

7. A fabrication method for a vertical luminous element, comprising the steps of:
1) providing a growth substrate, on which a luminous epitaxial layer is formed via epitaxial growth, which at least comprises an n-type layer, an active layer and a p-type layer from down up;
2) defining the size of a single LED and dividing the luminous epitaxial layer into two LED series; wherein, the LEDs in the first series are adjacent to the LEDs of the second series;
3) providing an insulating substrate, on which bonding metal layer cell arrays are fabricated. An isolating area is provided among the bonding metal layer cells;
4) transferring the first LED series to the patterned bonding metal layer of the insulating substrate; the n-type layer is the light-emitting surface and each LED corresponds to a bonding metal layer cell;
5) through the second substrate transfer, transferring the second LED series to the patterned bonding metal layer of the insulating substrate; the p-type layer is the light-emitting surface and each bonding metal layer cell consists of a first series LED and a second series LED, which are arranged reversely with an isolating area provided;
6) filling the isolating area and fabricating the conductive structure on the isolating area and the element surface such that the LED cells are connected into an LED sequence of cascaded structure.

8. The fabrication method of vertical luminous element according to claim 7, further comprising: the step 7) fabricates the electrode structures on the first and last LEDs of the LED sequence to form a series circuit.

9. The fabrication method of vertical luminous element according to claim 7, further comprising: the step 7) fabricates two electrodes that are arranged symmetrically and are connected with two adjacent luminous cells, thus forming a series-parallel circuit.

10. The fabrication method of vertical luminous element according to claim 7, characterized in that the step 5) includes: providing a temporary substrate and connecting the second LED series with the temporary substrate; lifting off the growth substrate to isolate the second LED series from the growth substrate; and connecting the second LED series with the permanent substrate and removing the temporary substrate.

* * * * *